(12) United States Patent
Kim et al.

(10) Patent No.: US 12,300,490 B2
(45) Date of Patent: May 13, 2025

(54) METHOD OF MANUFACTURING INTEGRATED CIRCUIT DEVICE

(71) Applicant: SAMSUNG ELECTRONICS CO., LTD., Suwon-si (KR)

(72) Inventors: Sookyung Kim, Seongnam-si (KR); Chan Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 993 days.

(21) Appl. No.: 17/358,346

(22) Filed: Jun. 25, 2021

(65) Prior Publication Data

US 2022/0181146 A1 Jun. 9, 2022

(30) Foreign Application Priority Data

Dec. 7, 2020 (KR) .................. 10-2020-0169840

(51) Int. Cl.
*H01L 21/027* (2006.01)
*G03F 1/22* (2012.01)
*G03F 7/00* (2006.01)

(52) U.S. Cl.
CPC ............ *H01L 21/0274* (2013.01); *G03F 1/22* (2013.01); *G03F 7/70033* (2013.01)

(58) Field of Classification Search
CPC ........... H01L 21/0274; H01L 21/31144; H01L 21/266; G03F 1/22; G03F 7/70033; G03F 7/0045; G03F 7/094; G03F 7/095; G03F 7/11; G03F 7/38; G03F 7/2004; G03F 7/2022; H10B 12/34

USPC ......... 430/270.1, 271.1, 272.1, 311; 438/694
See application file for complete search history.

(56) References Cited

U.S. PATENT DOCUMENTS

| 9,650,357 | B2 | 5/2017 | Enomoto |
| 9,798,241 | B2 | 10/2017 | Kim et al. |
| 10,020,195 | B2 | 7/2018 | Scheer et al. |
| 10,672,619 | B2 | 6/2020 | Wang et al. |
| 10,892,223 | B2 | 1/2021 | Schenker et al. |
| 2003/0148212 | A1* | 8/2003 | Lee ........................ G03F 7/0392 430/313 |
| 2009/0104559 | A1* | 4/2009 | Houlihan ................ C07C 55/08 562/583 |
| 2011/0076626 | A1* | 3/2011 | Padmanaban .......... G03F 7/091 430/326 |
| 2012/0177891 | A1 | 7/2012 | Millward et al. |

(Continued)

FOREIGN PATENT DOCUMENTS

| KR | 10-0301058 B1 | 9/2001 |
| KR | 10-2016-0023728 A | 3/2016 |

(Continued)

*Primary Examiner* — Caleen O Sullivan
(74) *Attorney, Agent, or Firm* — Muir Patent Law, PLLC

(57) ABSTRACT

A method of manufacturing an integrated circuit (IC) device, the method including forming an underlayer on a feature layer such that the underlayer includes an acid generator; forming an acid-containing underlayer by generating a first acid from the acid generator; forming a photoresist film on the acid-containing underlayer; generating a second acid in a first area of the photoresist film by exposing the first area of the photoresist film; diffusing the first acid from the acid-containing underlayer into the first area of the photoresist film; and forming a photoresist pattern by developing the photoresist film.

20 Claims, 21 Drawing Sheets

(56) References Cited

U.S. PATENT DOCUMENTS

| | | | |
|---|---|---|---|
| 2015/0241782 A1* | 8/2015 | Scheer | G03F 7/091 |
| | | | 430/325 |
| 2018/0031978 A1 | 2/2018 | Park et al. | |
| 2019/0096662 A1* | 3/2019 | Hong | G03F 7/091 |
| 2020/0098558 A1 | 3/2020 | Liu et al. | |

FOREIGN PATENT DOCUMENTS

| | | |
|---|---|---|
| KR | 10-2016-0086163 A | 7/2016 |
| KR | 10-2016-0127069 A | 11/2016 |
| KR | 10-2018-0012528 A | 2/2018 |
| KR | 10-2019-0090372 A | 8/2019 |

* cited by examiner

METHOD OF MANUFACTURING INTEGRATED CIRCUIT DEVICE

CROSS-REFERENCE TO RELATED APPLICATION

Korean Patent Application No. 10-2020-0169840, filed on Dec. 7, 2020 in the Korean Intellectual Property Office, and entitled: "Method of Manufacturing Integrated Circuit Device," is incorporated by reference herein in its entirety.

BACKGROUND

1. Field

Embodiments relates to a method of manufacturing an integrated circuit (IC) device.

2. Description of the Related Art

As IC devices have rapidly been downscaled and highly integrated, a technique for ensuring the dimensional precision of a pattern to be formed when the pattern is formed using a photolithography process has been considered.

SUMMARY

The embodiments may be realized by providing a method of manufacturing an integrated circuit (IC) device, the method including forming an underlayer on a feature layer such that the underlayer includes an acid generator; forming an acid-containing underlayer by generating a first acid from the acid generator; forming a photoresist film on the acid-containing underlayer; generating a second acid in a first area of the photoresist film by exposing the first area of the photoresist film; diffusing the first acid from the acid-containing underlayer into the first area of the photoresist film; and forming a photoresist pattern by developing the photoresist film.

The embodiments may be realized by providing a method of manufacturing an integrated circuit (IC) device, the method including forming an underlayer on a feature layer such that the underlayer includes a first acid generator; forming an acid-containing underlayer by generating a first acid from the first acid generator, generating the first acid being performed by exposing at least a partial region of the underlayer; forming a photoresist film on the acid-containing underlayer such that the photoresist film includes a second acid generator; exposing a first area of the photoresist film to generate a second acid in the first area of the photoresist film; diffusing at least some of the first acid from the acid-containing underlayer into the first area of the photoresist film; forming a photoresist pattern by developing the photoresist film that includes at least some of the first acid in the first area of the photoresist film; and processing the feature layer using the photoresist pattern.

The embodiments may be realized by providing a method of manufacturing an integrated circuit (IC) device, the method including forming a mask layer on a substrate; forming an underlayer on the mask layer such that the underlayer includes a first acid generator; forming an acid-containing underlayer by exposing the underlayer with a first light such that the acid-containing underlayer includes an acid; forming a photoresist film on the acid-containing underlayer such that the photoresist film includes a chemically amplified polymer and a second acid generator; exposing a first area of the photoresist film with a second light, the second light having a different wavelength from the first light; diffusing at least some of the acid from the acid-containing underlayer into the exposed first area of the photoresist film; forming a photoresist pattern by developing the photoresist film that includes at least some of the acid in the first area of the photoresist film; and forming a mask pattern including a plurality of holes by etching the mask layer using the photoresist pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
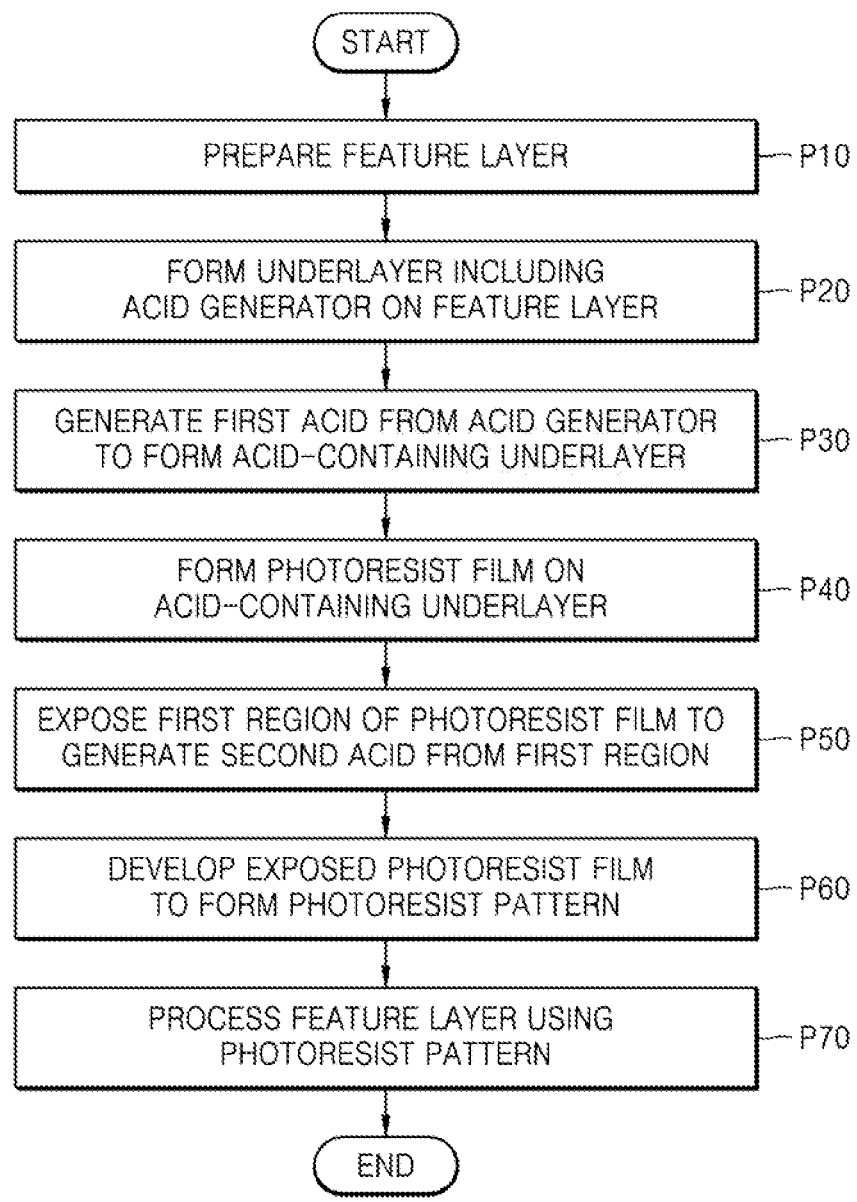
FIG. 1 is a flowchart of a method of manufacturing an integrated circuit (IC) device, according to embodiments.

FIG. 1 is a flowchart of a method of manufacturing an integrated circuit (IC) device, according to embodiments. FIGS. 2A to 2H are cross-sectional views of stages in a method of manufacturing an IC device, according to embodiments.

Figure 2A:
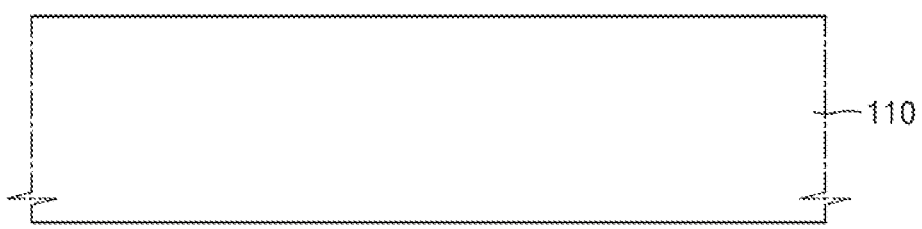
FIGS. 2A to 2H are cross-sectional views of stages in a method of manufacturing an IC device, according to embodiments.

Referring to FIGS. 1 and 2A, in process P10 of FIG. 1, a feature layer 110 may be prepared.

In an implementation, the feature layer 110 may include a semiconductor substrate. In an implementation, the feature layer 110 may include a semiconductor element, e.g., silicon (Si) or germanium (Ge), or a compound semiconductor, e.g., silicon germanium (SiGe), silicon carbide (SiC), gallium arsenide (GaAs), indium arsenide (InAs), or indium phosphide (InP). In an implementation, the feature layer 110 may include a conductive film, dielectric film, insulating film, or a combination thereof, which is formed on the semiconductor substrate. In an implementation, the feature layer 110 may include a metal, an alloy, a metal carbide, a metal nitride, a metal oxynitride, a metal oxycarbide, a semiconductor, polysilicon, oxide, nitride, oxynitride, or a combination thereof. As used herein, the term "or" is not an exclusive term, e.g., "A or B" would include A, B, or A and B.

Figure 2B:
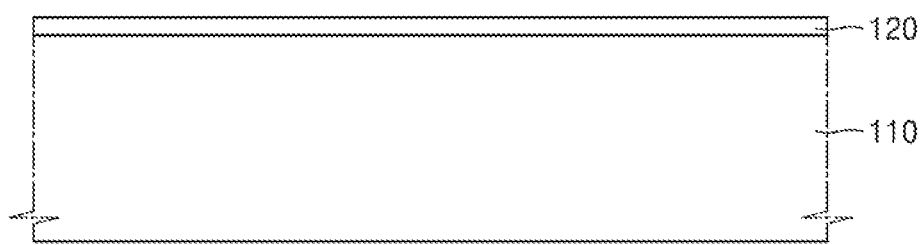

Referring to FIGS. 1 and 2B, in process P20, an underlayer 120 including an acid generator may be formed on the feature layer 110.

In an implementation, the acid generator included in the underlayer 120 may include a photoacid generator (PAG), a thermoacid generator (TAG), or a combination thereof.

The PAG may generate acid when exposed to, e.g., ultraviolet (UV) light, a krypton fluoride (KrF) excimer laser (248 nm), an argon fluoride (ArF) excimer laser (193 nm), a fluorine ($F_2$) excimer laser (157 nm), or extreme ultraviolet (EUV) light (13.5 nm). The PAG may include, e.g., triarylsulfonium salts, diaryliodonium salts, sulfonates, or a mixture thereof. In an implementation, the PAG may include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyl diphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or a mixture thereof.

The TAG may include an aliphatic or alicyclic compound. In an implementation, the TAG may include a carbonate ester, a sulfonate ester, or a phosphate ester. In an implementation, the TAG may include cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, or adamantyl nonafluorobutanephosphonate.

In an implementation, to form the underlayer 120, the feature layer 110 may be coated with an underlayer composition. In addition to the acid generator, the underlayer composition may further include a resin and a crosslinking agent and further include an additive as desired. In the underlayer composition, the acid generator may be included in an amount of about 0.1% to about 10.0%, by weight based on a total weight of the resin included in the underlayer composition.

The resin that may be included in the underlayer composition may include an acryl resin, a methacrylic resin, a styrene resin, a cellulose resin, a phenol resin, an aromatic polyester resin, an aromatic polyimide resin, a polybenzoxazole (poly(benzoxazole)) resin, an aromatic polyamide resin, an acenaphthylene resin, an isocyanuric acid resin, or a combination thereof.

In an implementation, the resin that may be included in the underlayer composition may include a repeating unit containing a hydroxyl group, which is a crosslinking reactive group.

In an implementation, the resin that may be included in the underlayer composition may include a copolymer of non-crosslinking monomers. In an implementation, the non-crosslinking monomers may include, e.g., an acrylic acid ester such as a C1 to C10 alkyl acrylate; a methacrylic acid ester such as a C1 to C10 alkyl methacrylate; an acrylamide such as acrylamide, N-alkylacrylamide, and N-aryl acrylamide; a methacrylamide such as methacrylamide, N-alkyl methacrylamide, and N-aryl methacrylamide; a vinyl ether such as alkyl vinyl ether and vinyl aryl ether; a vinyl ester such as vinyl butyrate, vinyl isobutylate, and vinyl trimethyl acetate; an allyl compound such as allyl acetic acid, allyl caproic acid, allyl caprylic acid, allyl lauric acid, allyl palmitic acid, allyl stearic acid, allyl benzoic acid, and allyl acetoacetic acid; a styrene such as styrene, alkylstyrene, alkoxystyrene, and halogenstyrene; or a crotonic acid ester such as butyl crotonate, hexyl crotonate, and glycerin monocrotonate.

In an implementation, the underlayer composition may further include a compound including a C6 to C30 aryl group in which some of carbon atoms are substituted with a halogen atom or a heteroatom-containing group. The heteroatom may include an oxygen atom, a sulfur atom, or a nitrogen atom. In an implementation, the heteroatom-containing group may include —O—, —C(=O)—O—, —O—C(=O)—, —C(=O)—, —O—C(=O)—O—, —C(=O)—NH—, —NH—, —S—, —S(=O)$_2$—, or —S(=O)$_2$—O—.

In an implementation, the underlayer composition may include a silicon material, e.g., polysiloxane. The polysiloxane may include a polymer having a siloxane bond. In an implementation, the polysiloxane may include a polymer including a repeating unit, e.g., monosiloxane, disiloxane, trisiloxane, or cyclotetrasiloxane.

In an implementation, the crosslinking agent that may be included in the underlayer composition may include, e.g., melamine, urea, polyhydric alcohol, or the like. In an implementation, the crosslinking agent may include a binuclear phenol, such as 4,4'-biphenyldiol, 4,4'-methylenebisphenol, 4,4'-ethylidenebisphenol, and bisphenol A; a trinuclear phenol, such as 4,4',4''-methylidene trisphenol and 4,4'-[1-[4-[1-(4-hydroxyphenyl)-1-methylethyl]phenyl]ethylidene]bisphenol; or a polyphenol, such as novolac.

In an implementation, the underlayer composition may further include an additive, e.g., a surfactant, an antifoaming agent, or a preservation stabilizer. The surfactant may help improve the coating uniformity and wetting of the underlayer 120 during the formation of the underlayer 120. In an implementation, the surfactant may include a sulfuric acid ester salt, a sulfonate, a phosphate ester, a soap, an amine salt, a quaternary ammonium salt, a polyethylene glycol, an alkylphenol ethylene oxide adduct, a polyhydric alcohol, a nitrogen-containing vinyl polymer, or a combination thereof. In an implementation, the surfactant may include alkylbenzene sulfonates, alkylpyridinium salts, polyethylene glycol, or quaternary ammonium salts.

To form the underlayer 120, the feature layer 110 may be coated with the underlayer composition, and an annealing process may be performed. The coating process may be performed using, e.g., a spin coating process, a spray coating process, or a deep coating process. The annealing process may be performed at a temperature of about 80° C. to about 150° C. for about 10 seconds to about 100 seconds. The underlayer 120 may be formed to a thickness of about 20 nm to about 500 nm.

The underlayer 120 may help improve adhesion between the feature layer 110 and a photoresist film 130, which is to be formed in a subsequent process, and may help prevent patterns from collapsing or peeling during the developing of the photoresist film 130. In an implementation, the underlayer 120 may include the acid generator, and the underlayer 120 may help improve resolution and sensitivity during a subsequent process of forming fine patterns.

Figure 2C:
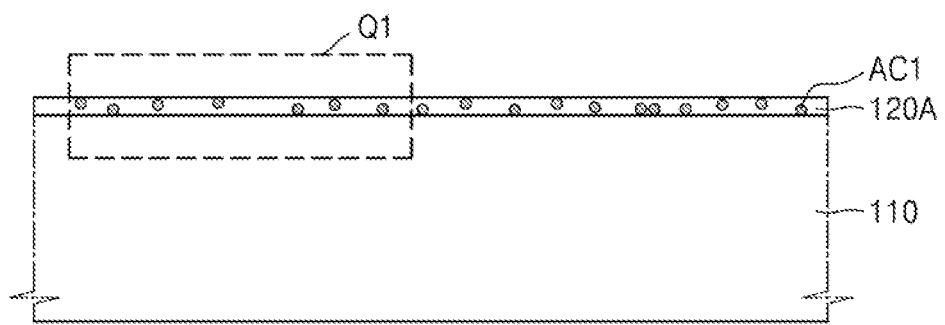

Referring to FIGS. 1 and 2C, in process P30, a first acid AC1 may be generated from the acid generator included in the underlayer 120 to form an acid-containing underlayer 120A. To form the acid-containing underlayer 120A, light, heat, or a combination thereof may be applied to the underlayer 120.

In an implementation, when the underlayer 120 includes the PAG, to form the acid-containing underlayer 120A, first light HV1 having a first wavelength may be irradiated to at least a partial region (e.g., a selected part) of the underlayer 120 to generate the first acid AC1 from the PAG.

In an implementation, the first light HV1 may include UV light having a wavelength of about 100 nm to about 300 nm, e.g., UV light having a wavelength selected in a range of about 100 nm to about 200 nm. In an implementation, the first light HV1 may be a KrF excimer laser (248 nm), an ArF excimer laser (193 nm), an $F_2$ excimer laser (157 nm), or EUV light (13.5 nm).

Figure 3A:
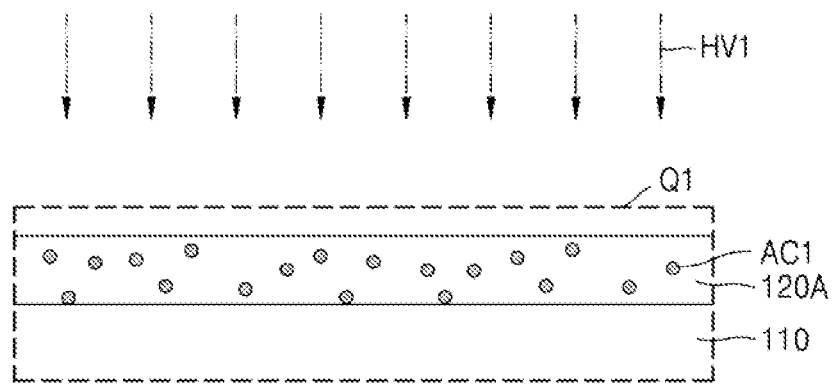
FIG. 3A is an enlarged cross-sectional view of partial region of FIG. 2C, according to an example embodiment.

FIG. 3A is an enlarged cross-sectional view of partial region Q1 of FIG. 2C, according to an example embodiment.

Referring to FIG. 3A, when an underlayer 120 includes a PAG, to form the acid-containing underlayer 120A in process P30 of FIG. 1, the first acid AC1 may be generated from the PAG included in the underlayer 120 by applying the first light HV1 (having the first wavelength) to at least a partial region of the underlayer 120.

In an implementation, when a TAG is included in the underlayer 120, unlike that shown in FIG. 3A, to form the acid-containing underlayer 120A, the first acid AC1 may be generated from the TAG by applying heat to the underlayer 120.

In an implementation, when the underlayer 120 includes the PAG and the TAG, to form the acid-containing underlayer 120A, the first acid AC1 may be generated from the PAG and the TAG by simultaneously or sequentially applying the first light HV1 and heat to at least a partial region of the underlayer 120.

After the first light HV1 or heat is applied to at least the partial region of the underlayer 120 to form the acid-containing underlayer 120A, a process of cooling the acid-containing underlayer 120A may be further performed. The cooling process may be performed for about 10 seconds to about 500 seconds.

Figure 2D:
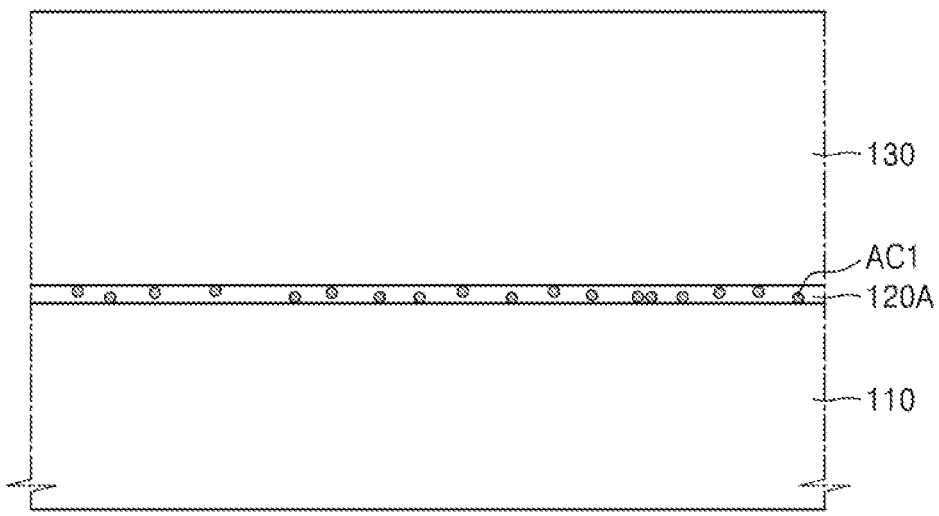

Referring to FIGS. 1 and 2D, in process P40, a photoresist film 130 may be formed on the acid-containing underlayer 120A.

In an implementation, to form the photoresist film 130, a photoresist composition including a chemically amplified polymer, a PAG, and a solvent may be used.

The chemically amplified polymer may include a polymer including a repeating unit of which solubility in a developer may be changed by the action of acid. The chemically amplified polymer may be a block copolymer or a random copolymer. In an implementation, the chemically amplified polymer may include positive-type photoresist.

In an implementation, the chemically amplified polymer may include a repeating unit, which decomposes by the action of acid and increases solubility in an alkali developer. In an implementation, the chemically amplified polymer may include a repeating unit, which decomposes by the action of acid and generates phenolic acid or BrØnsted acid corresponding to the phenolic acid. In an implementation, the chemically amplified polymer may include a first repeating unit, which is derived from hydroxystyrene or derivatives thereof. The derivatives of hydroxystyrene may include hydroxystyrenes in which a hydrogen atom at an a position is substituted with a C1 to C5 alkyl group or a C1 to C5 halogenated alkyl group, and derivatives thereof. For example, the first repeating unit may be derived from 3-hydroxystyrene, 4-hydroxystyrene, 5-hydroxy-2-vinylnaphtalene, or 6-hydroxy-2-vinylnaphtalene.

In an implementation, the chemically amplified polymer may have a structure in which the first repeating unit derived from hydroxystyrene or the hydroxystyrene derivative is copolymerized with a second repeating unit having an acid-labile protecting group. The second repeating unit may include a (meth)acrylate polymer. In an implementation, the second repeating unit may include a binary or ternary copolymer of repeating units of polymethylmethacrylate (PMMA), poly(t-butylmethacrylate), poly(methacrylic acid), poly(norbornylmethacrylate), or the (meth)acrylate polymer.

In an implementation, the chemically amplified polymer may include a blend of a first polymer having the first repeating unit and a second polymer having the second repeating unit.

The acid-labile group, which may be included in the second repeating unit, may include tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyl-lactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, or a triethoxysilyl group.

In an implementation, the chemically amplified polymer may further include a third repeating unit having an acrylate derivative substituent including a hydroxyl group (—OH) or a fourth repeating unit having a protecting group substituted with fluorine.

The chemically amplified polymer may have a weight-average molecular weight of about 1,000 to about 500,000. In the photoresist composition, the chemically amplified polymer may be included at a content of about 1% to about 25% by weight, based on a total weight of the photoresist composition.

In the photoresist composition, the PAG may be included at a content of about 0.1% to about 5.0% by weight, based on a total weight of the chemically amplified polymer. A type of PAG that may be included in the photoresist composition may be substantially the same as that of PAG, which may be included in the underlayer 120 as described with reference to FIG. 2B.

The photoresist composition may further include a basic quencher. The basic quencher may trap acids, which diffuse or flow into a non-exposed area of the photoresist film 130 from the outside of the non-exposed area of the photoresist film 130 when the photoresist film 130 is exposed during a process described below with reference to FIG. 2E. In an implementation, the basic quencher may include a primary aliphatic amine, a secondary aliphatic amine, a tertiary aliphatic amine, an aromatic amine, a heterocyclic amine, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, amides, imides, carbamates, or ammonium salts. In an implementation, the basic quencher may include a photo-decomposable base. The photo-decomposable base may include a compound, which generates acid due to exposure and neutralizes the acid before exposure. The photo-decomposable base may include a carboxylate or sulfonate salt of a photo-decomposable cation.

In the photoresist composition, the solvent may include an organic solvent. In an implementation, the solvent may include an ether, an alcohol, a glycol ether, an aromatic hydrocarbon compound, a ketone, or an ester.

The photoresist composition may further include an organic base including aliphatic amine. The organic base may include a primary amine, a secondary amine, or a tertiary amine. The organic base may include triethanol amine, triethyl amine, tributyl amine, tripropyl amine, hexamethyl disilazane, or a combination thereof.

The photoresist composition may further include a surfactant. The surfactant may be substantially the same as that of the surfactant included in the underlayer 120 as provided with reference to FIG. 2B. When the surfactant is included in the photoresist composition, the surfactant may help improve the coating uniformity and wetting of the photoresist composition.

In an implementation, to form the photoresist film 130 in process P40 of FIG. 1 and the process of FIG. 2D, a metal-containing photoresist composition having a metal structure including an organic metal compound, organic metal nanoparticles, or an organic metal cluster may be used. The metal structure may include a metal core including a metal atom and an organic ligand surrounding the metal core. The organic ligand may be bonded to the metal core. In the metal structure, an ionic bond, a covalent bond, a metal bond, or a van der Waals bond may be present between the metal core and the organic ligand. The metal core may include a metal element. The metal element may have the form of a metal atom, a metal ion, a metal compound, a metal alloy, or a combination thereof. The metal compound may include a metal oxide, a metal nitride, a metal oxynitride, a metal silicide, a metal carbide, or a combination thereof. In an implementation, the metal core may include tin (Sn), antimony (Sb), indium (In), bismuth (Bi), silver (Ag), tellurium (Te), gold (Au), lead (Pb), zinc (Zn), titanium (Ti), hafnium (Hf), zirconium (Zr), aluminum (Al), vanadium (V), chromium (Cr), cobalt (Co), nickel (Ni), copper (Cu), gallium (Ga), or iron (Fe). The organic ligand may include a C1 to C30 linear alkyl, C1 to C30 branched alkyl, C3 to C30 cycloalkyl, C2 to C30 alkenyl, C2 to C30 alkynyl, C6 to C30 aryl, C3 to C30 allyl, C1 to C30 alkoxy, C6 to C30 aryloxy, or a combination thereof. The organic ligand may include a hydrocarbyl group, which is substituted with a heteroatom functional group including an oxygen atom, a nitrogen atom, a halogen element, cyano, thio, silyl, ether, carbonyl, ester, nitro, amino, or a combination thereof. The halogen element may be fluorine (F), chlorine (Cl), bromine (Br), or iodine (I).

In an implementation, the metal structure may include (tBu)Sn(NEt$_2$)$_2$(OtBu), (tBu)Sn(NEt$_2$)(NH$_2$)(OtBu), (tBu)Sn(NEt$_2$)(OtBu)$_2$, (Me)Sn(NEt$_2$)(OtBu)$_2$, (Me)Sn(NEt$_2$)$_2$(OtBu), (tBu)$_2$Sn(NEt$_2$)(OtBu), (Me)$_2$Sn(NEt$_2$)(OtBu), (Me)(tBu)Sn(NEt$_2$)$_2$, (Me)(tBu)Sn(NEt$_2$)(OtBu), (iPr)(tBu)Sn(NMe$_2$)(OtBu), or a combination thereof. Herein, the abbreviation "Me" refers to a methyl group, "Et" refers to an ethyl group, and "tBu" refers to a ter-butyl group.

In an implementation, to form the photoresist film 130 on the acid-containing underlayer 120A in process P40 of FIG. 1 and the process of FIG. 2D, the photoresist composition may be coated on the acid-containing underlayer 120A and annealed. The coating process may be performed using, e.g., a spin coating process, a spray coating process, or a deep coating process. The process of annealing the photoresist composition may be performed at a temperature of about 80° C. to about 150° C. for about 10 seconds to about 100 seconds A thickness of the photoresist film 130 may be several times to several hundred times a thickness of the acid-containing underlayer 120A. The photoresist film 130 may be formed to a thickness of about 100 nm to about 6 µm.

Figure 2E:
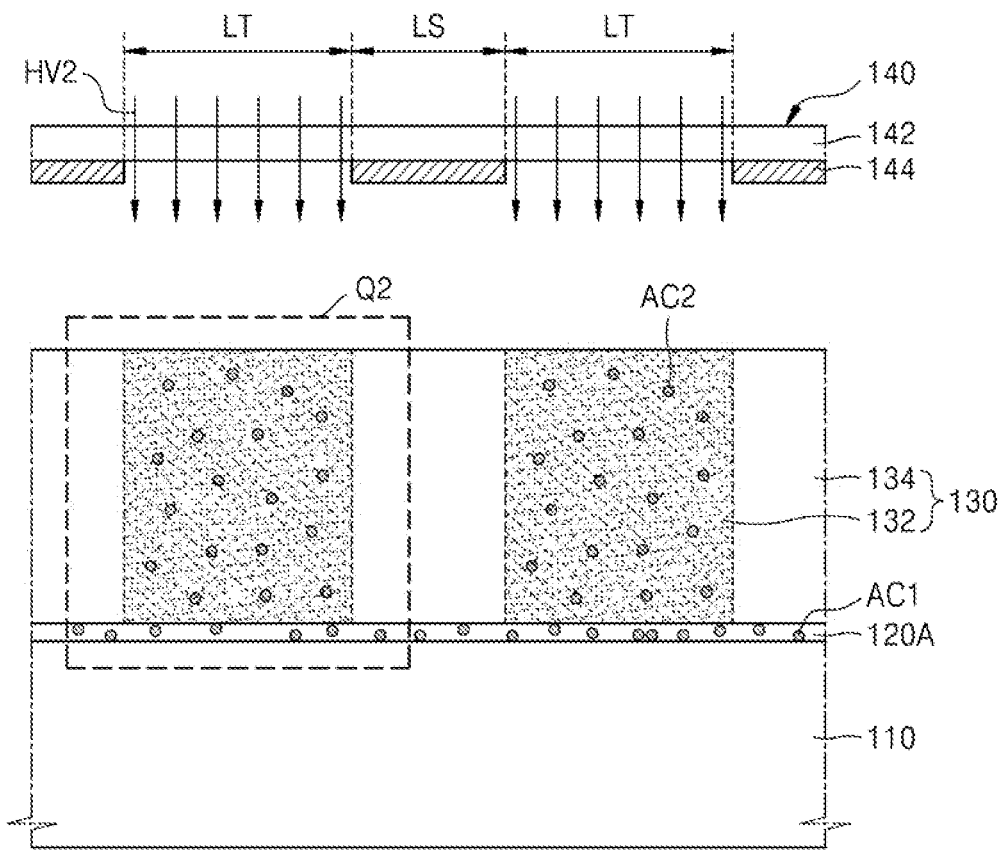

Referring to FIGS. 1 and 2E, in process P50, a first area 132, which is a portion of the photoresist film 130, may be exposed to generate a second acid AC2 in the first area 132 of the photoresist film 130.

Figure 3B:
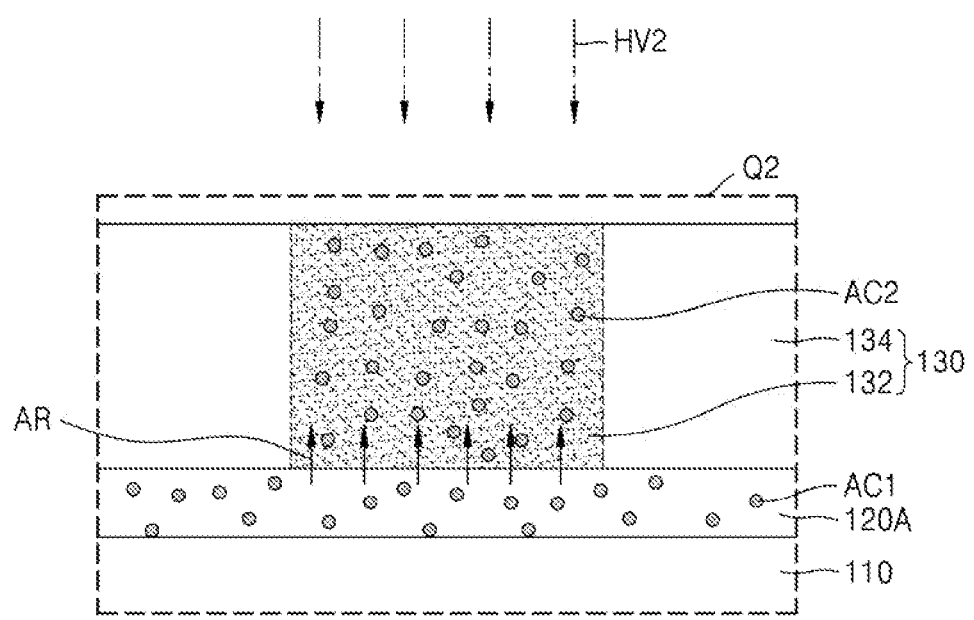
FIG. 3B is an enlarged cross-sectional view of partial region of FIG. 2E, according to an example embodiment.

FIG. 3B is an enlarged cross-sectional view of partial region Q2 of FIG. 2E, according to an example embodiment.

Referring to FIG. 3B, in process P50 of FIG., a first area 132 of the photoresist film 130 may be exposed to generate a second acid AC2 in the first area 132 of the photoresist film 130.

When the photoresist film 130 includes a chemically amplified polymer, the chemically amplified polymer included in the photoresist film 130 may be deprotected by the second acid AC2 in the first area 132 of the photoresist film 130.

To expose the first area 132 of the photoresist film 130, a photomask 140 having a plurality of light-shielding areas LS and a plurality of light-transmitting areas LT may be arranged at a predetermined position on the photoresist film 130, and the first area 132 of the photoresist film 130 may be exposed through the plurality of light-transmitting areas LT of the photomask 140.

In an implementation, to expose the first area 132 of the photoresist film 130, second light HV2 having a second wavelength may be irradiated to the first area 132 of the photoresist film 130. In an implementation, the second wavelength may be smaller than the first wavelength of the first light HV1 described with reference to FIG. 3A. In an implementation, the second light HV2 may include EUV light. The EUV light may have a wavelength of about 1 nm to about 31 nm. In an implementation, the EUV light may have a wavelength of about 13.5 nm. In an implementation, to expose the first area 132 of the photoresist film 130, a KrF excimer laser (248 nm), an ArF excimer laser (193 nm), or an F$_2$ excimer laser (157 nm) may be used.

The photomask 140 may include a transparent substrate 142 and a plurality of light-shielding patterns 144 formed in or at the plurality of light-shielding areas LS on the transparent substrate 142. The transparent substrate 142 may include quartz. The plurality of light-shielding patterns 144 may include chromium (Cr). The plurality of light-transmitting areas LT may be defined by the plurality of light-shielding patterns 144. In an implementation, the photomask 140 may include an EUV photomask.

In an implementation, after the first area 132 of the photoresist film 130 is exposed, an annealing process may be performed to diffuse the second acid AC2 in (e.g., throughout) the first area 132 of the photoresist film 130. In an implementation, directly after the first area 132 of the photoresist film 130 is exposed, the resultant structure including the photoresist film 130 may be annealed at a temperature of about 50° C. to about 150° C. Thus, the second acid AC2 may be relatively uniformly distributed in the first area 132 of the photoresist film 130. The annealing process may be performed for about 10 seconds to about 100 seconds. In an implementation, the annealing process may be performed at a temperature of about 100° C. for about 60 seconds.

In an implementation, an additional annealing process may not be performed to diffuse the second acid AC2 in the first area 132 of the photoresist film 130. In this case, during the exposing of the first area 132 of the photoresist film 130, the second acid AC2 may diffuse in the first area 132 of the photoresist film 130 due to exposure heat without an additional annealing process.

In an implementation, during the exposing of the first area 132 of the photoresist film 130, the second acid AC2 may diffuse in the first area 132 and simultaneously, at least some of the first acid AC1 in the acid-containing underlayer 120A may also diffuse into the first area 132 of the photoresist film 130 in a direction of arrows AR. Thus, the amount of acid in the first area 132 of the photoresist film 130 may be further increased.

As described above, the first acid AC1 and the second acid AC2 may be present in the first area 132, which is an exposed area of the photoresist film 130. As a result, due to the first acid AC1 and the second acid AC2, an acid-labile group may be deprotected from a chemically amplified polymer included in the photoresist film 130 in the first area 132 of the photoresist film 130, and thus, the first area 132 of the photoresist film 130 may be changed to a state in which the first area 132 may be easily dissolved in an alkali developer. Thus, a difference in acidity between the first area 132, which is the exposed area, and a second area 134, which is a non-exposed area, may be increased. Accordingly, a difference in solubility in a developer between the exposed area and the non-exposed area of the photoresist film 130 may be increased. Thus, resolution may be improved during a subsequent development process, and the critical dimension (CD) uniformity of a photoresist pattern 130P, which will be obtained in a process described below with reference to FIG. 2F, may be improved.

In an implementation, when the photoresist film 130 includes metal structures, while the photoresist film 130 is being exposed in the process P50 of FIG. 1 and process described with reference to FIG. 2E, metal atoms included in the photoresist film 130 may be crosslinked at a relatively high density in the first area 132 of the photoresist film 130, and thus, a network of the metal structures may be formed densely. In an implementation, a difference in solubility in developer between the first area 132, which is the exposed area of the photoresist film 130, and the second area 134, which is the non-exposed area of the photoresist film 130, may be increased.

Figure 2F:
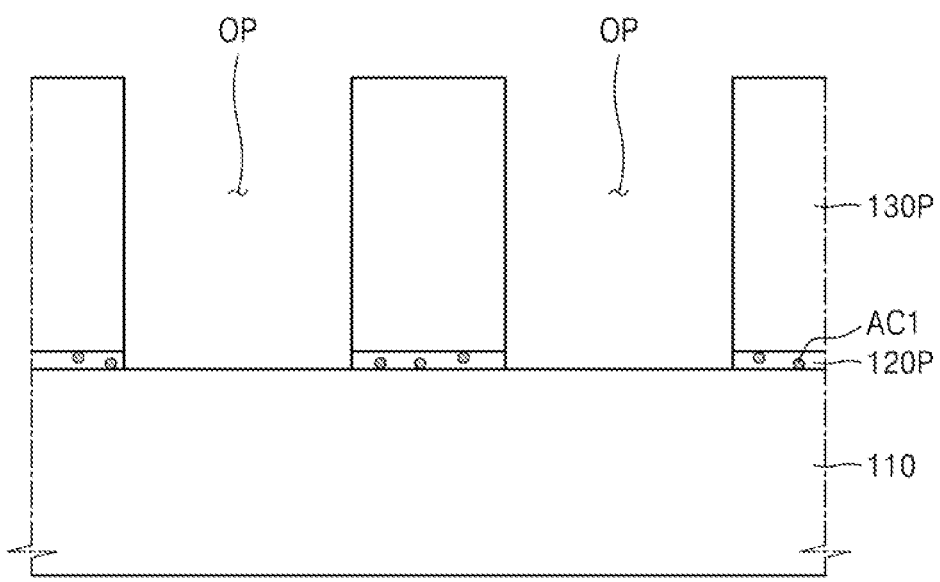

Referring to FIGS. 1 and 2F, in process P60, the exposed photoresist film 130 may be developed to form the photoresist pattern 130P.

In an implementation, to form the photoresist pattern 130P, the photoresist film 130 may be developed by a positive-tone development (PTD) process using an alkali developer to remove the first area 132 of the photoresist film 130. As a result, the photoresist pattern 130P including the second area 134, which is a non-exposed area, may be formed. The photoresist pattern 130P may include a plurality of openings OP. Portions of the acid-containing underlayer 120A, which are exposed through the plurality of openings OP, may be removed to form an acid-containing underlayer pattern 120P.

The alkali developer may include 2.38% by weight of a tetramethylammonium hydroxide (TMAH) solution. The chemically amplified polymer may remain deprotected by the first acid AC1 and the second acid AC2 in the first area 132 of the photoresist film 130 in the resultant product of FIG. 2E. Accordingly, the first area 132 may be cleanly removed during the developing of the photoresist film 130 with the alkali developer. Accordingly, after the photoresist film 130 is developed, residue defects, such as a footing phenomenon, may not occur, and the photoresist pattern 130P may obtain a vertical sidewall profile. In addition, when the feature layer 110 is processed using the photoresist pattern 130P, a CD of an intended processing region may be precisely controlled in the feature layer 110.

In an implementation, when the photoresist film 130 includes metal structures, metal atoms included in the photoresist film 130 may be crosslinked at a relatively high density in the exposed first area 132 of the photoresist film 130 in the resultant structure of FIG. 2E, and thus, a network of the metal structures may be densely formed. In an implementation, when the photoresist film 130 includes metal structures, the exposed photoresist film 130, which is the resultant structure of FIG. 2E, may be developed using a negative-tone development (NTD) process. Thus, the second area 134, which is the non-exposed area of the photoresist film 130, may be removed, and the photoresist pattern 130P including the first area 132, which is the exposed area of the photoresist film 130, may be formed. In this case, the acid-containing underlayer 120A, which is exposed through a space formed after removing the second area 134, which is the non-exposed area, may be removed, and a portion of the acid-containing underlayer 120A may remain under the first area 132, which is the exposed areas of the photoresist film 130. When the photoresist film 130 is developed using the NTD process, a difference in solubility in developer between the first area 132, which is the exposed area of the photoresist film 130, and the second area 134, which is the non-exposed area of the photoresist film 130, may be increased.

To develop the photoresist film 130 using the NTD process, n-butyl acetate or 2-heptanone may be used as a developer.

In an implementation, when the photoresist film 130 includes metal structures, the exposed photoresist film 130 may be developed using a PTD process to form a photoresist pattern including a non-exposed area of the photoresist film 130.

Figure 2G:
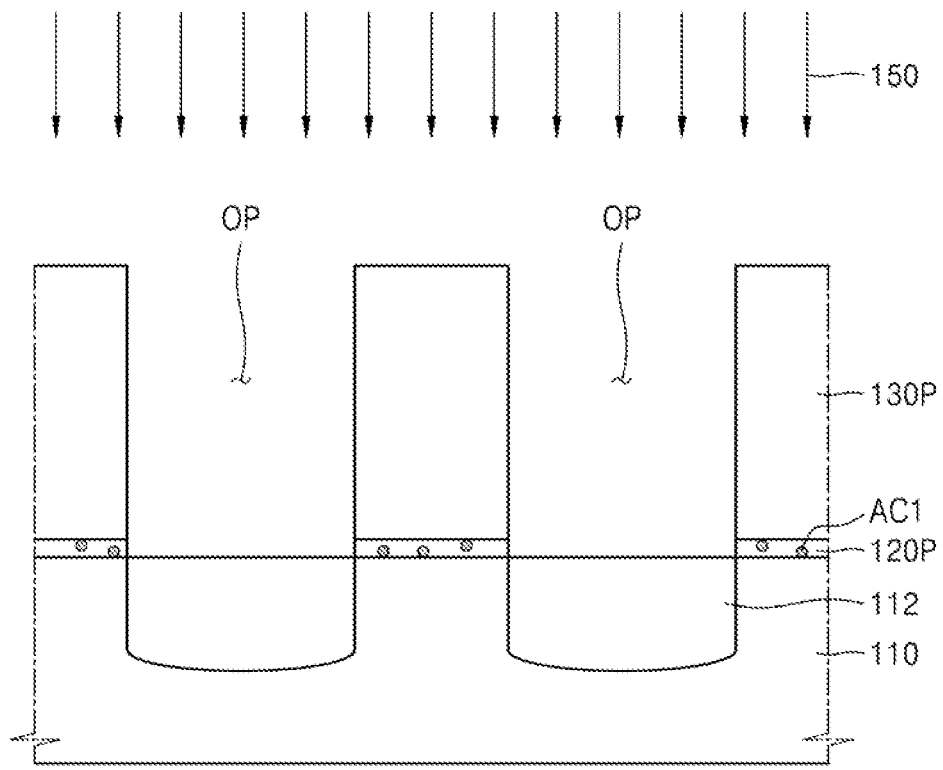

Referring to FIGS. 1 and 2G, in process P70, the feature layer 110 may be processed using the photoresist pattern 130P of the resultant structure of FIG. 2F.

In an implementation, various processes including a process of implanting impurity ions into the feature layer 110 through the plurality of openings OP of the photoresist pattern 130P, a process of etching the feature layer 110 through the plurality of openings OP, a process of forming an additional film on the feature layer 110 through the plurality of openings OP, and a process of modifying a portion of the feature layer 110 through the plurality of openings OP may be performed.

FIG. 2G illustrates an ion implantation process as an example of processing the feature layer 110 exposed through the plurality of openings OP. As shown in FIG. 2G, impurity ions 150 may be implanted into the feature layer 110 through the plurality of openings OP, thereby forming a plurality of wells 112 in the feature layer 110. Each of the plurality of wells 112 may include an impurity region into which the impurity ions 150 are implanted.

Figure 2H:
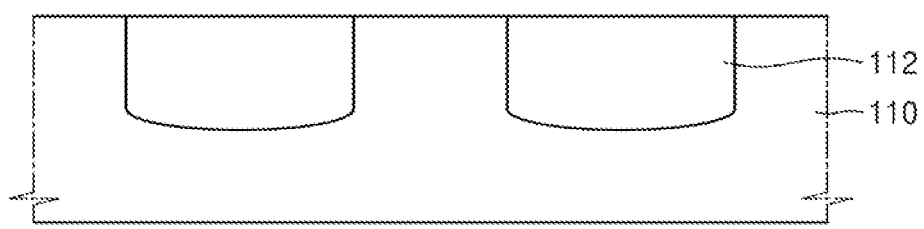

Referring to FIG. 2H, the photoresist pattern 130P and the acid-containing underlayer pattern 120P, which remain on the feature layer 110, may be removed from the resultant structure of FIG. 2G. The photoresist pattern 130P and the acid-containing underlayer pattern 120P may be removed using an ashing process and a strip process.

In the method of manufacturing the IC device according to the embodiments described with reference to FIGS. 1 and 2A to 2H, after the underlayer 120 is formed and before the photoresist film 130 is formed on the underlayer 120, the first acid AC1 may be generated in the underlayer 120 by applying light, heat, or a combination thereof to the underlayer 120 to form the acid-containing underlayer 120A. Accordingly, after the exposing of the photoresist film 130, not only the first acid AC1 diffused from the acid-containing underlayer 120A, but also the second acid AC2, may be present in the first area 132, which is the exposed area of the photoresist film 130. Thus, a difference in acidity between the first area 132, which is the exposed area, and the second area 134, which is the non-exposed area, may be increased. Accordingly, a difference in solubility in a developer between the exposed area and the non-exposed area of the photoresist film 130 may be increased.

An EUV lithography technique incorporating an exposure process using EUV light having a wavelength of about 13.5 nm may be an advanced technique for superseding a lithography process using a KrF excimer laser (248 nm) and an ArF excimer laser (193 nm). An EUV lithography process may be based on a different action mechanism from the lithography process using the KrF excimer laser and the ArF excimer laser. The entire EUV lithography process may be performed in vacuum. Because an EUV lithography system lacks power required for a light source to irradiate laser light, there may be a limit to sufficiently increasing a dose to generate a required amount of acid from a PAG, from among components of a photoresist composition, during an exposure process. Thus, when an EUV lithography process is performed using other methods, acid generation efficiency and an exposure speed may be low due to a relatively low dose provided by a light source of the EUV lithography system. Accordingly, it could be difficult to obtain a desired exposure sensitivity.

In the method of manufacturing the IC device according to the embodiments, before the photoresist film 130 is formed, the first acid AC1 may be generated in the underlayer 120 by applying light, heat, or a combination thereof to the underlayer 120. Thus, after a partial region of the photoresist film 130 is exposed, the first acid AC1 and the second acid AC2 may be present in the first area 132, which is the exposed area. Thus, a difference in acidity between the exposed area and a non-exposed area of the photoresist film 130 may be increased, and thus, a difference in solubility in a developer between the exposed area and the non-exposed area of the photoresist film 130 may be increased and contrast may be increased. Accordingly, defects in the distribution of CDs of the photoresist pattern 130P obtained by developing the exposed photoresist film 130 may be suppressed to achieve a high pattern fidelity.

Figure 4:
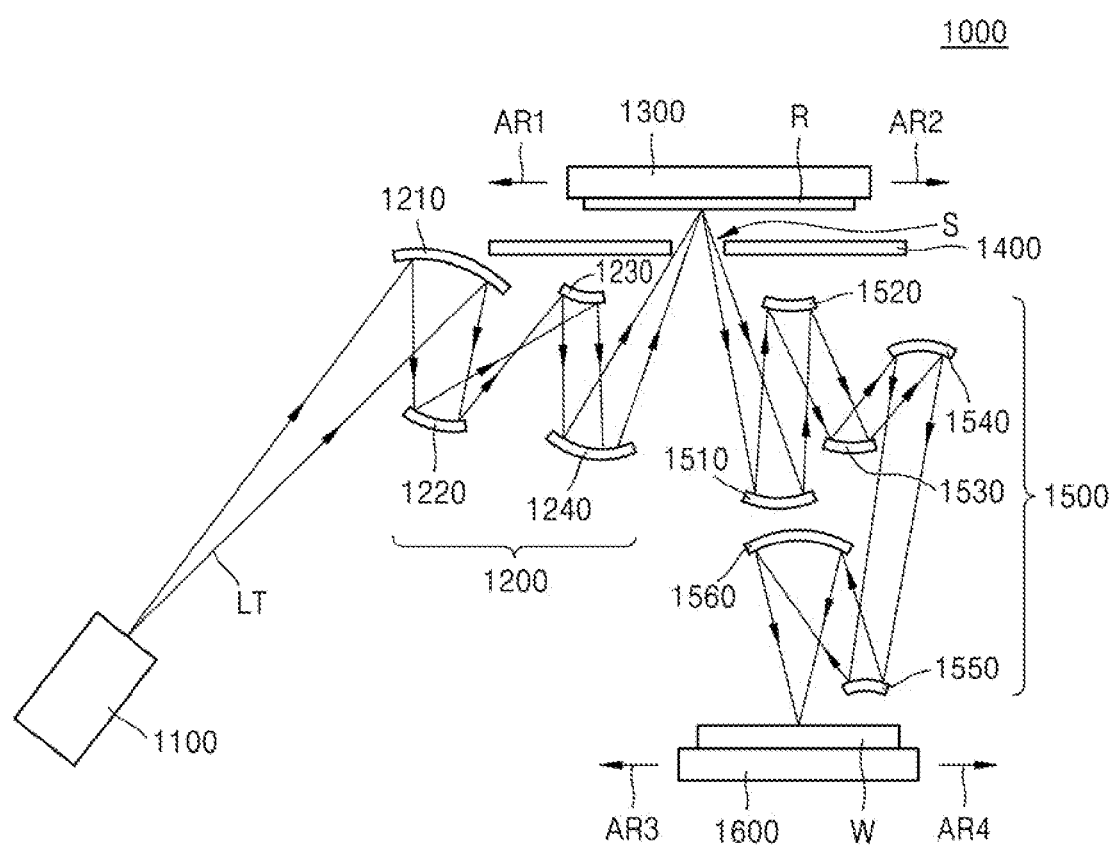
FIG. 4 is a schematic diagram of main components of a photolithography apparatus, which may be used in a method of manufacturing an IC device, according to embodiments.

FIG. 4 is a schematic diagram of main components of a photolithography apparatus 1000, which may be used in a method of manufacturing an IC device, according to embodiments.

Referring to FIG. 4, the photolithography apparatus 1000 may include a light generating device 1100 according to embodiments. The photolithography apparatus 1000 may include a contrast optical system 1200, a reticle stage 1300, a blinder 1400, a projection optical system 1500, and a wafer stage 1600.

EUV light LT generated by the light generating device 1100 may be irradiated to the contrast optical system 1200. The EUV light LT may have a wavelength of about 1 nm to about 31 nm. For instance, the EUV light LT may have a wavelength of about 13.5 nm.

The contrast optical system 1200 may include a plurality of mirrors (e.g., 1210, 1220, 1230, and 1240). The mirrors 1210, 1220, 1230, and 1240 may condense and transmit the EUV light LT to reduce the loss of the EUV light LT. The mirrors 1210, 1220, 1230, and 1240 may entirely uniformly control a distribution of intensities of the EUV light LT. The mirrors 1210, 1220, 1230, and 1240 may include a concave mirror, a convex mirror, or a combination thereof to obtain various paths of the EUV light LT. In an implementation, as illustrated in FIG. 4, the contrast optical system 1200 may include four mirrors 1210, 1220, 1230, and 1240, or the number and positions of mirrors included in the contrast optical system 1200 may be variously modified and changed. The contrast optical system 1200 may include an independent vacuum chamber and further include various lenses and optical elements, which are not shown in FIG. 4.

The reticle stage 1300 may move in a horizontal direction as indicated by arrows AR1 and AR2 while a reticle R is mounted on the reticle stage 1300 using an electrostatic chuck. The reticle R may be mounted on a bottom surface of the reticle stage 1300 such that a surface of the reticle R (on which optical patterns are formed) faces downward. The blinder 1400 may be under the reticle stage 1300. The blinder 1400 may include a slit S. The slit S may shape the form of the EUV light LT transmitted from the contrast optical system 1200 to the reticle R mounted on the reticle stage 1300. The EUV light LT transmitted from the contrast optical system 1200 may pass through the slit S of the blinder 1400 and be irradiated to a surface of the reticle R.

The EUV light LT reflected from the reticle R fixed at the reticle stage 1300 may pass through the slit S and be transmitted to the projection optical system 1500. The projection optical system 1500 may receive the EUV light LT, which has passed through the slit S, and transmit the EUV light LT to a wafer W. The projection optical system 1500 may reduce and project patterns formed in the reticle R on the substrate W.

The projection optical system 1500 may include a plurality of mirrors (e.g., 1510, 1520, 1530, 1540, 1550, and 1560). The mirrors 1510, 1520, 1530, 1540, 1550, and 1560 may correct various aberrations. In an implementation, as illustrated in FIG. 4, the projection optical system 1500 may include six mirrors 1510, 1520, 1530, 1540, 1550, and 1560, or the number and positions of mirrors included in the projection optical system 1500 may be variously modified and changed.

The wafer stage 1600 may move in a lateral direction as indicated by arrows AR3 and AR4. In an implementation, the paths of the EUV light LT may be as illustrated by the arrows, or may be other paths.

Figure 5:
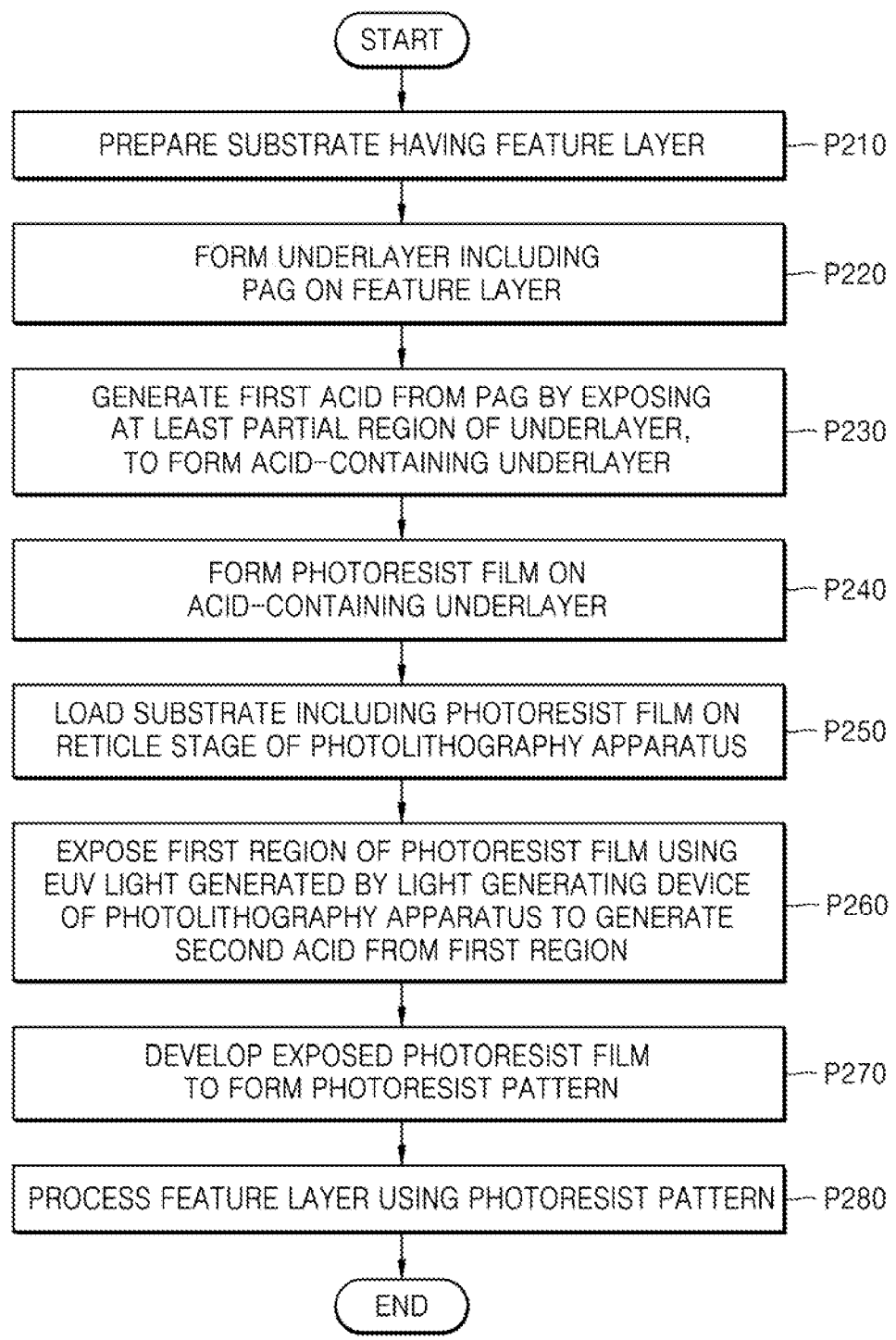
FIG. 5 is a flowchart of a method of manufacturing an IC device, according to embodiments.

FIG. 5 is a flowchart of a method of manufacturing an IC device, according to embodiments. The method of manufacturing the IC device, according to the embodiments, will be described with reference to FIGS. 2A to 2H, 4, and 5.

Referring to FIG. 5, in process P210, a substrate including a feature layer may be prepared.

The substrate may include a semiconductor element, such as Si or Ge, or a compound semiconductor, such as SiGe, SiC, GaAs, InAs, or InP. The substrate may have various device isolation structures, such as a shallow trench isolation (STI) structure. The substrate may have a structure in which a film, e.g., an insulating film, a conductive film, a semiconductor film, a metal film, a metal oxide film, a metal nitride film, a polymer film, or a combination thereof, is formed on a semiconductor wafer.

In an implementation, the substrate may include the semiconductor wafer, and the feature layer may be formed on the semiconductor wafer. In this case, the feature layer may include a conductive layer or an insulating layer. In an implementation, the feature layer may include a metal, a semiconductor, or an insulating material. In an implementation, the feature layer may be a portion of the substrate.

In process P220 of FIG. 5, an underlayer 120 including a PAG may be formed on the feature layer using a method similar to that described with reference to FIG. 2B.

In process P230 of FIG. 5, at least a portion of the underlayer 120 formed in the process P220 of FIG. 5 may be exposed using the method described with reference to FIG. 2C. Thus, a first acid AC1 may be generated from the PAG included in the underlayer 120 to form an acid-containing underlayer 120A.

In an implementation, to expose at least a portion of the underlayer 120, UV light having a wavelength selected in a range of about 100 nm to about 300 nm, for example, UV light having a wavelength selected in a range of about 100 nm to about 200 nm, may be used.

In process P240 of FIG. 5, a photoresist film 130 may be formed on the acid-containing underlayer 120A using a method similar to that described with reference to FIG. 2D. The photoresist film 130 may include a EUV resist material.

In process P250 of FIG. 5, the substrate on which the photoresist film 130 is formed as shown in FIG. 2D may be loaded on the reticle stage 1300 of the photolithography apparatus 1000 shown in FIG. 4.

Referring to FIGS. 4 and 5, in process P260, the first area 132 of the photoresist film 130 may be exposed by using EUV light LT generated by the light generating device 1100 of the photolithography apparatus 1000. As a result, a second acid AC2 may be generated in the exposed first area 132 of the photoresist film 130 using a method similar to that described with reference to FIG. 2E. During or after the exposing of the photoresist film 130, the second acid AC2 may be diffused in (e.g., throughout) the first area 132 and during the diffusion of the second acid AC2 in the first area 132 of the photoresist film 130, at least some of the first acid AC1 from the acid-containing underlayer 120A may be diffused into the first area 132 of the photoresist film 130. Thus, the amount of acid in the first area 132 of the photoresist film 130 may be further increased.

In process P270 of FIG. 5, a photoresist pattern 130P may be formed on the substrate by developing the exposed photoresist film 130 using a method similar to that described with reference to FIG. 2F.

In process P280 of FIG. 5, the feature layer may be processed using the photoresist pattern 130P using a method similar to that described with reference to FIG. 2G.

In an implementation, to process the feature layer, the feature layer may be etched using the photoresist pattern 130P as an etch mask to form a feature pattern. In an implementation, to process the feature layer, impurity ions may be implanted into the feature layer by using the photoresist pattern 130P as an ion implantation mask. In an implementation, to process the feature layer, an additional process film may be formed on the feature layer, which is exposed through the photoresist pattern 130P formed in process P270. The process film may include a conductive film, an insulating film, a semiconductor film, or a combination thereof.

Figure 6:
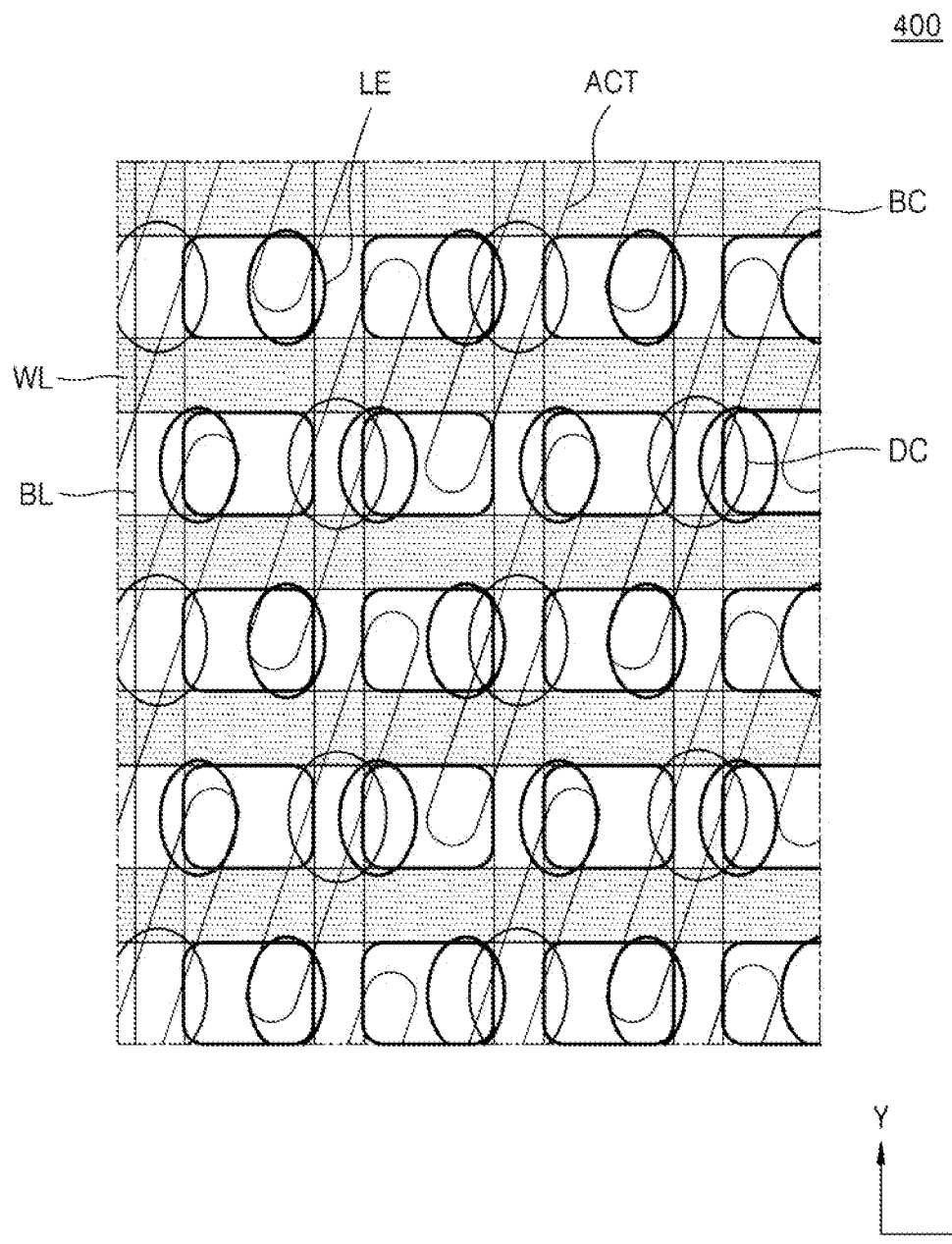
FIG. 6 is a schematic plan layout of main components of a cell array region of an IC device, which may be implemented according to a method of manufacturing an IC device, according to embodiments.

FIG. 6 is a schematic plan layout of main components of a cell array region of an IC device 400, which may be implemented according to a method of manufacturing an IC device 400, according to embodiments.

Referring to FIG. 6, the IC device 400 may include a plurality of active regions ACT. The plurality of active regions ACT may extend lengthwise in an oblique direction with respect to each of an X direction and a Y direction.

A plurality of word lines WL may intersect with the plurality of active regions ACT and extend parallel to each other in the X direction. A plurality of bit lines BL may extend parallel to each other in the Y direction in the plurality of word lines WL. The plurality of bit lines BL may be connected to the plurality of active regions ACT through direct contacts DC.

A plurality of buried contacts BC may be between two adjacent ones of the plurality of bit lines BL. The plurality of buried contacts BC may be arranged in a line in the X direction and the Y direction.

A plurality of lower electrodes LE may be on the plurality of buried contacts BC. The plurality of lower electrodes LE may be connected to the active regions ACT through the plurality of buried contacts BC.

FIGS. 7A to 7G are cross-sectional views of stages in a method of manufacturing an IC device, according to embodiments. An example method of manufacturing the IC device 400 shown in FIG. 6 will be described with reference to FIGS. 7A to 7G.

Figure 7A:
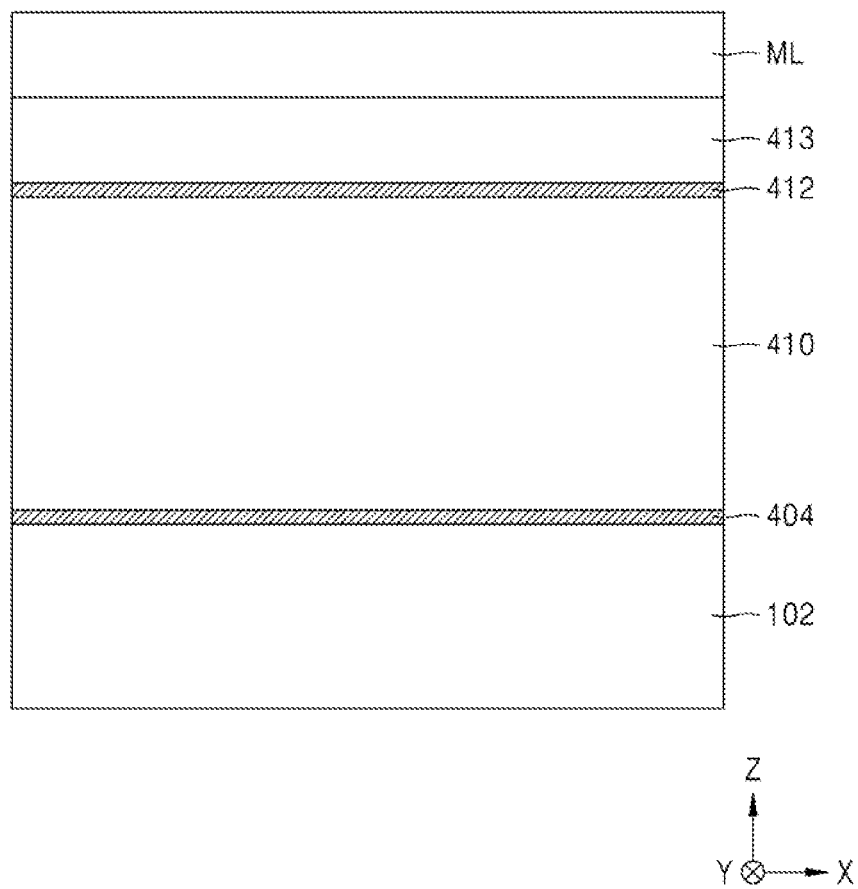
FIGS. 7A to 7G are cross-sectional views of stages in a method of manufacturing an IC device, according to embodiments.

Referring to FIG. 7A, an etch stop layer 404, a mold layer 410, a support layer 412, and a sacrificial layer 413 may be sequentially formed on a substrate 102, and a mask layer ML may be formed on the sacrificial layer 413.

The substrate 102 may include a semiconductor substrate. In an implementation, the substrate 102 may include a semiconductor, such as Si or Ge. In an implementation, the substrate 102 may include a compound semiconductor, such as SiGe, SiC, GaAs, InAs, or InP. The substrate 102 may include a conductive region, e.g., a doped well or a doped structure. In addition, the substrate 102 may include a device isolation structure, such as an STI structure. In an implementation, the substrate 102 may include a cell array region of dynamic random access memory (DRAM).

A plurality of active regions (refer to ACT in FIG. 6) and a plurality of conductive regions may be formed in the substrate 102.

The etch stop layer 404 may include a silicon nitride, a silicon oxynitride, or a combination thereof. The mold layer 410 may include a silicon oxide. The support layer 412 may include silicon nitride, silicon carbonitride, tantalum oxide, titanium oxide, or a combination thereof. The sacrificial layer 413 may include borophosphosilicate glass (BPSG), phosphosilicate glass (PSG), undoped silicate glass (USG), spin on dielectric (SOD), or an oxide formed using a high-density plasma (HDP) chemical vapor deposition (CVD) process. In an implementation, as illustrated in the drawings, a one support layer 412 may be provided on the mold layer 410, or the mold layer 410 may include a plurality of partial mold layers, and at least one middle support layer may be further provided between the respective partial mold layers.

The mask layer ML may include a polysilicon film, a silicon oxide film, a silicon carbonitride (SiCN) film, a carbon-containing film including a spin-on hardmask (SOH) material, or a combination thereof. The carbon-containing film including the SOH material may include an organic compound having a relatively high carbon content of about 85% to about 99% by weight, based on the total weight thereof. The organic compound may include a hydrocarbon compound including an aromatic ring or a derivative thereof.

Figure 7B:
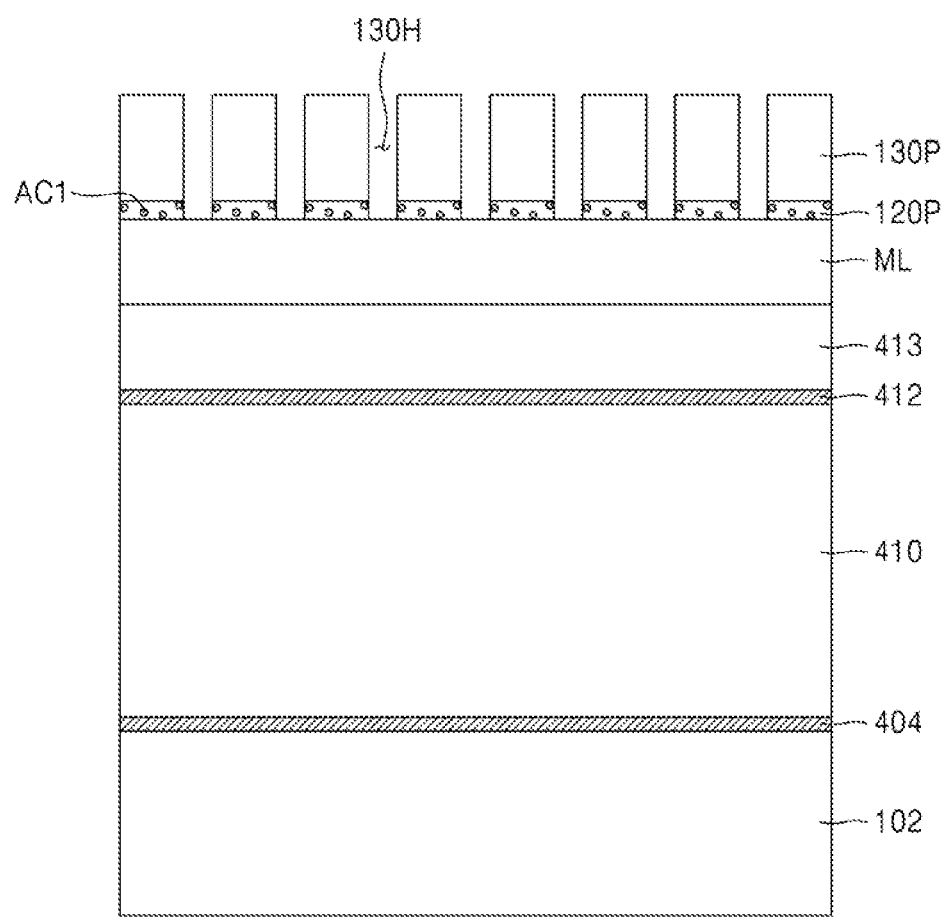

Referring to FIG. 7B, processes similar to the processes P20 to P60 of FIG. 1 and those described with reference to FIGS. 2B to 2F may be performed on the resultant structure of FIG. 7A, and thus, a photoresist pattern 130P may be formed on the mask layer ML. After the photoresist pattern 130P is formed, a portion of an acid-containing underlayer pattern 120P may remain between the mask layer ML and the photoresist pattern 130P.

A plurality of holes 130H exposing the mask layer ML may be formed in the photoresist pattern 130P. In an implementation, the plurality of holes 130H may be regularly arranged at a constant pitch to form a hexagonal array.

Figure 7C:
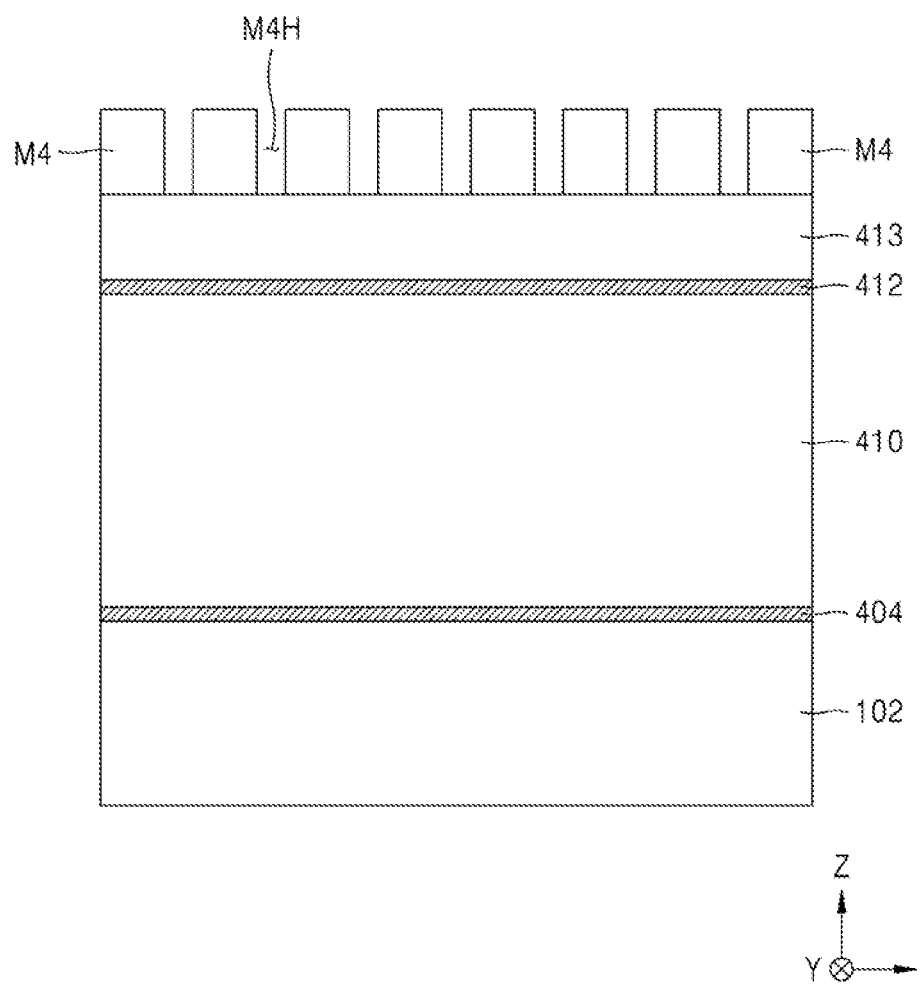

Referring to FIG. 7C, the mask layer ML may be anisotropically etched using the photoresist pattern 130P as an etch mask in the resultant structure of FIG. 7B to form a mask pattern M4.

A plurality of holes M4H may be formed in the mask pattern M4. A top surface of the sacrificial layer 413 may be exposed through the plurality of holes M4H formed in the mask pattern M4. In an implementation, the plurality of holes M4H may be regularly arranged at a constant pitch to form a hexagonal array.

Figure 7D:
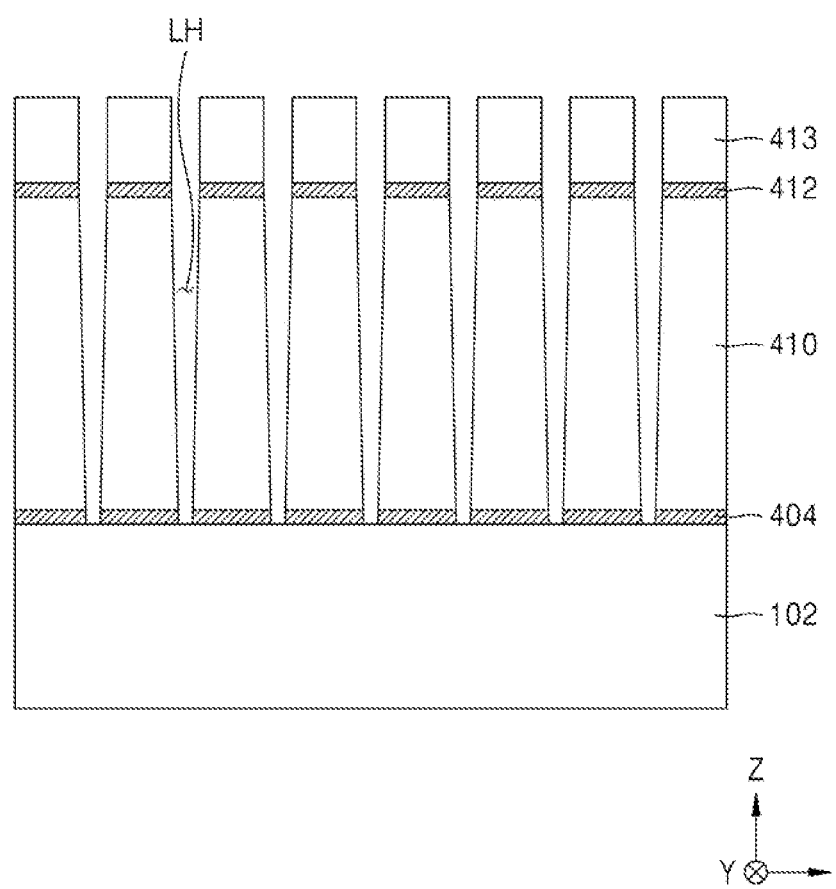

Referring to FIG. 7D, in the resultant structure of FIG. 7C, the sacrificial layer 413, the support layer 412, and the mold layer 410 may be sequentially etched by using the mask pattern M4 as an etch mask and using the etch stop layer 404 as an etch end point, and even the etch stop layer 404 may be continuously etched using an over-etching process. Thus, a plurality of lower electrode holes LH may be formed to expose a plurality of conductive regions in the substrate 102. After the plurality of lower electrode holes LH are formed, the mask pattern M4 and unnecessary films remaining on the mask pattern M4 may be removed to expose the top surface of the sacrificial layer 413.

Figure 7E:
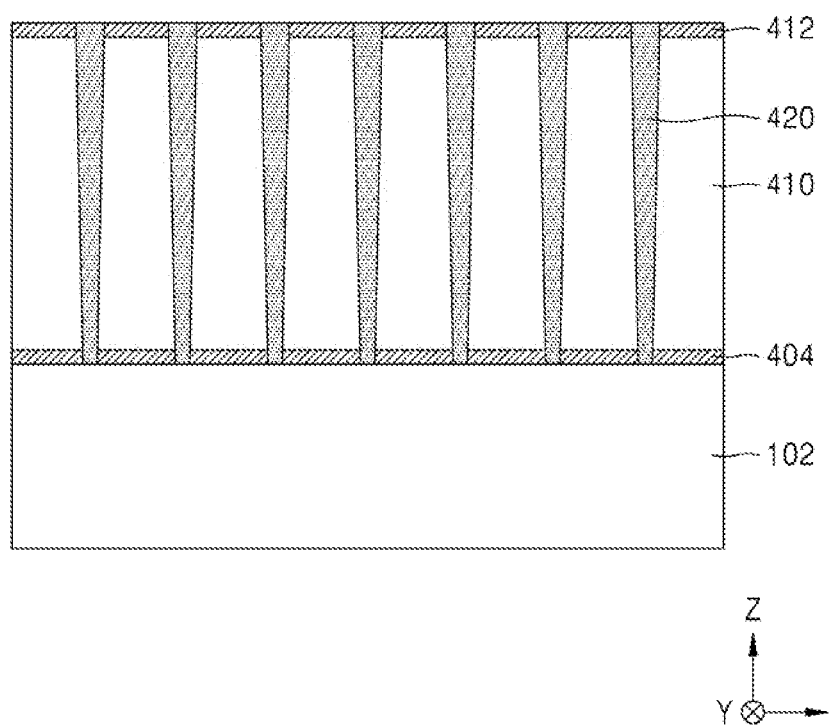

Referring to FIG. 7E, in the resultant structure of FIG. 7D, a conductive film for forming lower electrodes may be formed to fill each of the plurality of lower electrode holes LH and cover the top surface of the sacrificial layer 413. Thereafter, an upper portion of the conductive film for forming lower electrodes and the sacrificial layer 413 may be removed by performing an etchback process or a chemical mechanical polishing (CMP) process so that a top surface of the support layer 412 is exposed. Thus, a plurality of first conductive patterns 420 may be formed to fill the plurality of lower electrode holes LH, respectively. To form the conductive film for forming lower electrodes, a CVD process, a metal organic CVD (MOCVD) process, a physical vapor deposition (PVD) process, or an atomic layer deposition (ALD) process may be used. The plurality of first conductive patterns 420 may constitute the plurality of lower electrodes LE shown in FIG. 6.

In an implementation, the plurality of first conductive patterns 420 may each include a metal, a metal nitride, or a combination thereof. In an implementation, each of the plurality of first conductive patterns 420 may include titanium nitride (TiN), titanium aluminum nitride (TiAlN), tantalum nitride (TaN), tantalum aluminum nitride (TaAlN), tungsten (W), tungsten nitride (WN), ruthenium (Ru), ruthenium oxide ($RuO_2$), iridium (Ir), iridium oxide ($IrO_2$), platinum (Pt), platinum oxide (PtO), $SrRuO_3$ (SRO), $(Ba,Sr)RuO_3$ (BSRO), $CaRuO_3$ (CRO), $(La,Sr)CoO_3$ (LSCo), or a combination thereof.

Figure 7F:
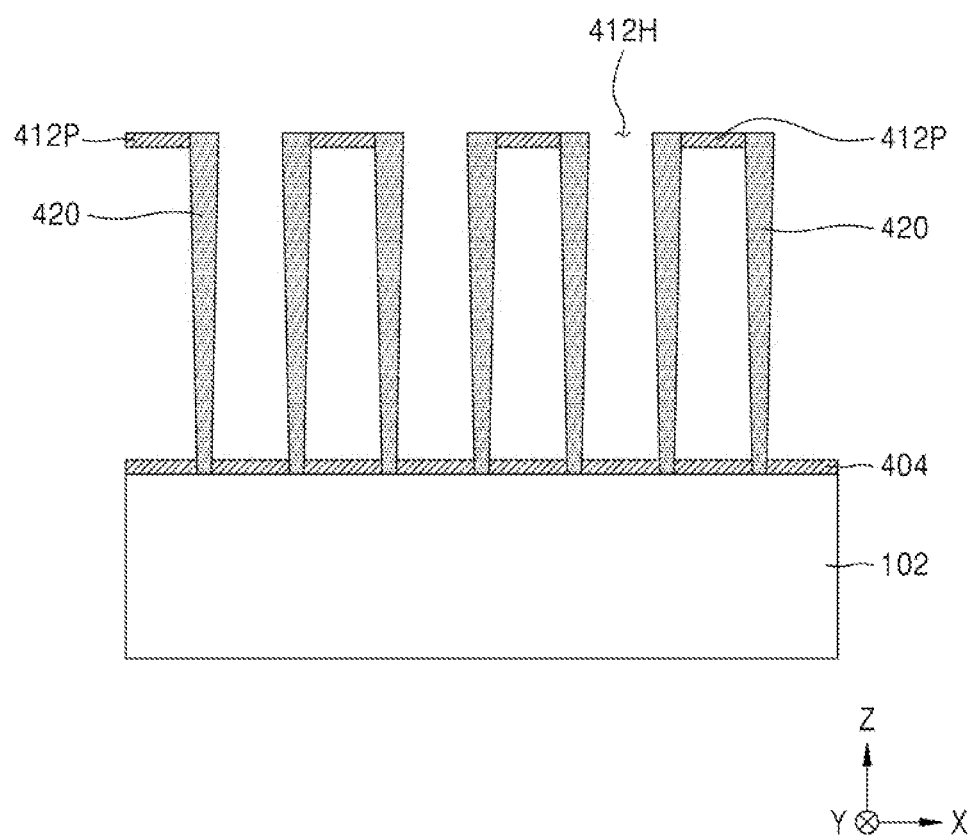

Referring to FIG. 7F, partial regions of the support layer 412 may be removed from the resultant structure of FIG. 7E to form a support pattern 412P having a plurality of openings 412H. Thereafter, the mold layer 410 may be removed through the plurality of openings 412H formed in the support pattern 412P to expose an outer wall of each of the plurality of first conductive patterns 420 and a top surface of the etch stop layer 404.

In an implementation, as illustrated in the drawings, one support pattern 412P may be provided on the mold layer 410, or the mold layer 410 includes a plurality of partial mold layers and at least one middle support layer is between the respective partial mold layers, and a process of removing the partial mold layers included in the mold layer 410 and a process of patterning the middle support layer may be sequentially performed from above so that the top surface of the etch stop layer 404 may be exposed.

Figure 7G:
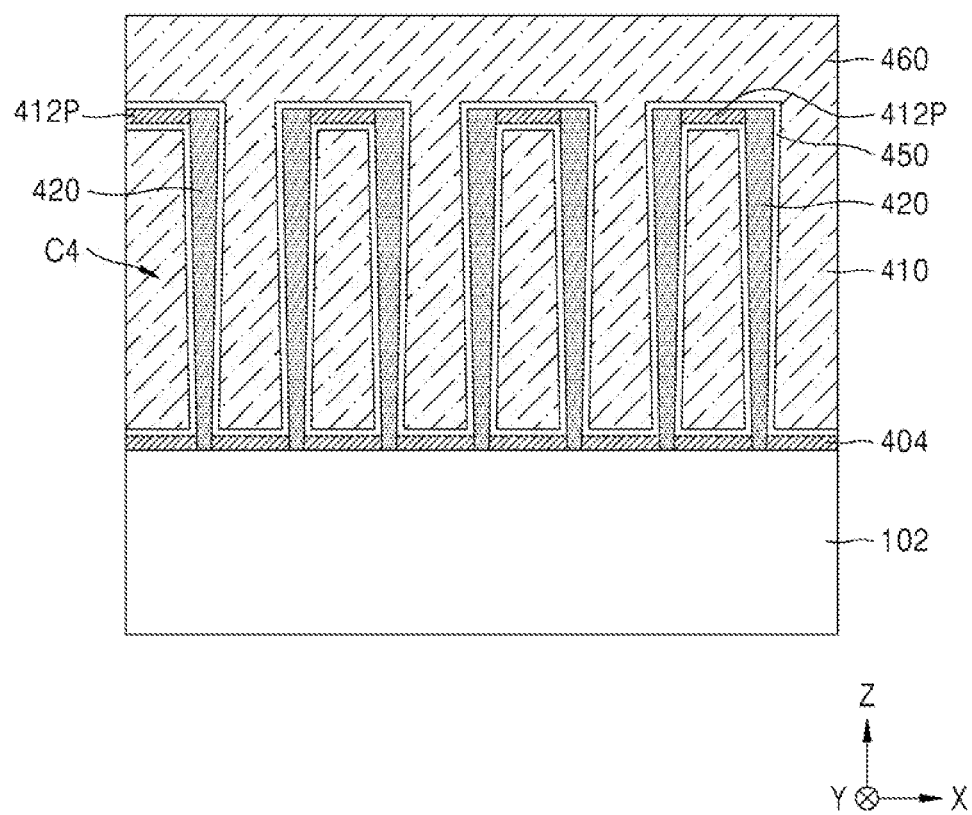

Referring to FIG. 7G, a dielectric film 450 and a second conductive pattern 460 may be formed on the resultant structure of FIG. 7F. The dielectric film 450 may be formed to conformally cover exposed surfaces of the plurality of first conductive patterns 420, an exposed surface of the support pattern 412P, and the top surface of the etch stop layer 404 in the resultant structure of FIG. 7F. The second conductive pattern 460 may be formed opposite the plurality of first conductive patterns 420 with the dielectric film 450 therebetween. The plurality of first conductive patterns 420, the dielectric film 450, and the second conductive pattern 460 may constitute a plurality of capacitors C4.

The dielectric film 450 may include a nitride, an oxide, a metal oxide, or a combination thereof. In an implementation, the dielectric film 450 may include a single film or a multilayered structure, which includes silicon nitride; silicon oxide; a metal oxide such as $HfO_2$, $ZrO_2$, $Al_2O_3$, $La_2O_3$, $Ta_2O_3$, and $TiO_2$; a perovskite dielectric material such as $SrTiO_3$ (STO), $(Ba,Sr)TiO_3$ (BST), $BaTiO_3$, lead zirconate titanate (PZT), and lanthanum-doped PZT (PLZT); or a combination thereof. The dielectric film 450 may have a thickness of about 50 Å to about 150 Å. The dielectric film 450 may be formed using a CVD process, a PVD process, or an ALD process.

The second conductive pattern 460 may include a doped semiconductor, a conductive metal nitride, a metal, a metal silicide, a conductive oxide, or a combination thereof. In an implementation, the second conductive pattern 460 may include TiN, TiAlN, TaN, TaAlN, W, WN, Ru, $RuO_2$, Ir, $IrO_2$, Pt, PtO, SRO, BSRO, CRO, LSCo, or a combination thereof. To form the second conductive pattern 460, a CVD process, an MOCVD process, a PVD process, or an ALD process may be used.

According to the method of manufacturing the IC device 400, which is described with reference to FIGS. 7A to 7G, when the lower electrode holes LH are formed in the mold layer 410 to form the plurality of lower electrodes (refer to LE in FIG. 6) included in the IC device 400, the process of forming the mask pattern M4 that is used as an etch mask may include processes similar to the processes P20 to P60 of FIG. 1 and the processes described with reference to FIGS. 2B to 2F. Accordingly, defects in the distribution of CDs of the plurality of holes M4H formed in the mask pattern M4 may be suppressed, and the dimensional precision of patterns required for the IC device 400 may be increased, thereby improving the productivity of a process of manufacturing the IC device 400.

The present embodiment pertains to an example in which the processes P20 to P60 of FIG. 1 and the processes described with reference to FIGS. 2B to 2F are applied to the process of forming the plurality of lower electrodes (refer to LE in FIG. 6) included in the IC device 400. In an implementation, the processes P20 to P60 of FIG. 1 and the processes described with reference to FIGS. 2B to 2F may be variously applied to form various components, such as a plurality of active regions ACT, a plurality of word lines WL, a plurality of bit lines BL, and a plurality of direct contacts DC, which are included in an IC device 400 shown in FIG. 6.

One or more embodiments may provide a method of manufacturing an IC device using a photolithography process.

One or more embodiments may provide a method of manufacturing an integrated circuit (IC) device, which may increase contrast by increasing a difference in solubility in a developer between an exposed area and a non-exposed area of a photoresist film in a photolithography process for manufacturing the IC device, and improve productivity by increasing the dimensional precision of a pattern for the IC device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit (IC) device, the method comprising:
    forming an underlayer on a feature layer such that the underlayer includes an acid generator;
    generating a first acid from the acid generator in the underlayer to form an acid-containing underlayer from the underlayer;
    forming a photoresist film on the acid-containing underlayer in which the first acid was generated;
    generating a second acid in a first area of the photoresist film formed on the acid-containing underlayer by exposing the first area of the photoresist film;
    diffusing the first acid from the acid-containing underlayer into the first area of the photoresist film; and
    forming a photoresist pattern by developing the photoresist film.

2. The method as claimed in claim 1, wherein the acid generator includes a photoacid generator (PAG), a thermoacid generator (TAG), or a combination thereof.

3. The method as claimed in claim 1, wherein generating the first acid from the acid generator in the underlayer to form the acid-containing underlayer includes exposing at least a partial region of the underlayer to generate the first acid.

4. The method as claimed in claim 1, wherein:
    generating the first acid from the acid generator in the underlayer to form the acid-containing underlayer includes irradiating a first light having a first wavelength to at least a partial region of the underlayer to generate the first acid, and
    generating the second acid in the first area includes irradiating a second light having a second wavelength to the first area of the photoresist film, the second wavelength being smaller than the first wavelength.

5. The method as claimed in claim 1, wherein:
    generating the first acid from the acid generator in the underlayer to form the acid-containing underlayer includes irradiating ultraviolet (UV) light to at least a partial region of the underlayer to generate the first acid, and
    generating the second acid in the first area includes irradiating extreme ultraviolet (EUV) light to the first area of the photoresist film.

6. The method as claimed in claim 1, wherein forming the underlayer includes coating the feature layer with an underlayer composition including the acid generator, a resin, and a crosslinking agent.

7. The method as claimed in claim 1, wherein developing the photoresist film includes removing the first area of the photoresist film.

8. The method as claimed in claim 1, wherein diffusing the first acid from the acid-containing underlayer into the photoresist film includes annealing the photoresist film after exposing the first area of the photoresist film.

9. A method of manufacturing an integrated circuit (IC) device, the method comprising:
    forming an underlayer on a feature layer such that the underlayer includes a first acid generator;
    generating a first acid from the first acid generator in the underlayer to form an acid-containing underlayer from the underlayer, generating the first acid being performed by exposing at least a partial region of the underlayer;
    forming a photoresist film on the acid-containing underlayer such that the photoresist film includes a second acid generator;
    exposing a first area of the photoresist film formed on the acid-containing underlayer to generate a second acid in the first area of the photoresist film;
    diffusing at least some of the first acid from the acid-containing underlayer into the first area of the photoresist film;
    forming a photoresist pattern by developing the photoresist film that includes at least some of the first acid in the first area of the photoresist film; and
    processing the feature layer using the photoresist pattern.

10. The method as claimed in claim 9, wherein:
    the first acid generator includes a first photoacid generator (PAG), and
    the second acid generator includes a second PAG.

11. The method as claimed in claim 9, wherein:
    generating the first acid from the first acid generator in the underlayer to form the acid-containing underlayer from the underlayer includes irradiating a first light having a first wavelength to at least the partial region of the underlayer, and
    exposing the first area of the photoresist film includes irradiating a second light having a second wavelength to the first area of the photoresist film, the second wavelength being smaller than the first wavelength.

12. The method as claimed in claim 9, wherein:
    generating the first acid from the first acid generator in the underlayer to form the acid-containing underlayer includes irradiating a first light having a wavelength of about 100 nm to about 300 nm to at least the partial region of the underlayer, and
    exposing the first area of the photoresist film includes irradiating a second light having a wavelength of about 1 nm to about 31 nm to the first area of the photoresist film.

13. The method as claimed in claim 9, wherein:
    forming the underlayer includes coating the feature layer with an underlayer composition including the first acid generator, a resin, and a crosslinking agent, and
    the resin includes an acryl resin, a methacrylic resin, a styrene resin, a cellulose resin, a phenol resin, an aromatic polyester resin, an aromatic polyimide resin, a polybenzoxazole resin, an aromatic polyamide resin, an acenaphthylene resin, an isocyanuric acid resin, or a combination thereof.

14. The method as claimed in claim 9, wherein forming the photoresist film includes coating the acid-containing underlayer with a photoresist composition including a chemically amplified polymer, a photoacid generator (PAG), and a solvent.

15. The method as claimed in claim 9, wherein forming the photoresist pattern includes forming the photoresist pattern including a plurality of holes by removing the first area of the photoresist film.

16. A method of manufacturing an integrated circuit (IC) device, the method comprising:
    forming a mask layer on a substrate;
    forming an underlayer on the mask layer such that the underlayer includes a first acid generator;
    generating a first acid from the first acid generator included in the underlayer to form an acid-containing underlayer from the underlayer by exposing the underlayer with a first light such that the acid-containing underlayer includes an acid;
    forming a photoresist film on the acid-containing underlayer such that the photoresist film includes a chemically amplified polymer and a second acid generator;
    exposing a first area of the photoresist film on the acid-containing underlayer with a second light, the second light having a different wavelength from the first light;
    diffusing at least some of the acid from the acid-containing underlayer into the exposed first area of the photoresist film;
    forming a photoresist pattern by developing the photoresist film that includes at least some of the acid in the first area of the photoresist film; and
    forming a mask pattern including a plurality of holes by etching the mask layer using the photoresist pattern.

17. The method as claimed in claim 16, wherein each of the first acid generator and the second acid generator includes a photoacid generator (PAG).

18. The method as claimed in claim 16, wherein:
    the first light includes ultraviolet (UV) light, and
    the second light includes extreme ultraviolet (EUV) light.

19. The method as claimed in claim 16, wherein exposing the first area of the photoresist film with the second light is performed simultaneously with diffusing at least some of the acid from the acid-containing underlayer into the exposed first area of the photoresist film.

20. The method as claimed in claim 16, wherein diffusing at least some of the acid from the acid-containing underlayer into the exposed first area of the photoresist film is performed after exposing the first area of the photoresist film with the second light.

* * * * *